United States Patent
Kalavade et al.

(10) Patent No.: US 9,977,622 B1
(45) Date of Patent: May 22, 2018

(54) BUFFER OPERATIONS IN MEMORY

(71) Applicant: Micron Technology, Inc., Boise, ID (US)

(72) Inventors: Pranav Kalavade, San Jose, CA (US); Shantanu R. Rajwade, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/359,306

(22) Filed: Nov. 22, 2016

(51) Int. Cl.
*G11C 16/04* (2006.01)
*G06F 3/06* (2006.01)
*G11C 16/10* (2006.01)

(52) U.S. Cl.
CPC ............ *G06F 3/0656* (2013.01); *G06F 3/061* (2013.01); *G06F 3/0679* (2013.01); *G11C 16/10* (2013.01)

(58) Field of Classification Search
CPC ...... G06F 3/0656; G06F 3/061; G06F 3/0679; G11C 16/10
See application file for complete search history.

(56) References Cited

U.S. PATENT DOCUMENTS

| | | | | |
|---|---|---|---|---|
| 7,451,366 B2* | 11/2008 | Youn | ............... | G11C 29/1201 365/201 |
| 8,654,580 B2* | 2/2014 | Kang | ............... | G11C 16/0483 365/185.03 |
| 8,885,409 B2* | 11/2014 | Lee | ............... | G11C 16/0483 365/185.1 |
| 9,436,634 B2 | 9/2016 | Canepa et al. | | |
| 9,477,595 B2 | 10/2016 | Karamcheti et al. | | |
| 9,484,097 B2 | 11/2016 | Kim | | |
| 2012/0008406 A1* | 1/2012 | Lee | ............... | G11C 16/0483 365/185.19 |
| 2016/0274794 A1 | 9/2016 | Yoon | | |
| 2016/0285757 A1 | 9/2016 | Srivastava et al. | | |
| 2016/0306590 A1 | 10/2016 | Kang | | |

* cited by examiner

*Primary Examiner* — Pho M Luu
(74) *Attorney, Agent, or Firm* — Brooks, Cameron & Huebsch, PLLC

(57) ABSTRACT

Apparatuses and methods for performing buffer operations in memory are provided. One example method can include storing second page data and third page data on a buffer while programming first page data during a first pass programming operation and programming the second page data and the third page data from the buffer to the array of memory cells during a second pass programming operation.

31 Claims, 4 Drawing Sheets

indicate a particular number of a particular feature so designated can be included with a number of embodiments of the present disclosure.

BUFFER OPERATIONS IN MEMORY

TECHNICAL FIELD

The present disclosure relates generally to memory devices, and more particularly, to apparatuses and methods for performing buffering operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
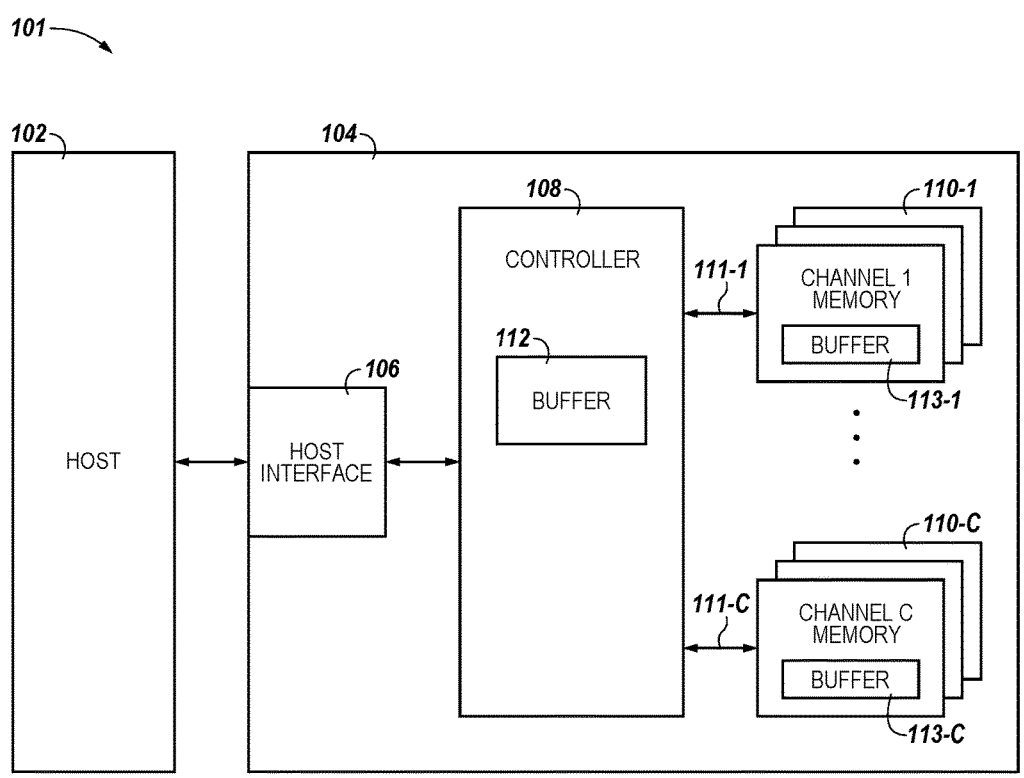
FIG. 1 is a block diagram of an apparatus in the form of a computing system including at least one memory system in accordance with a number of embodiments of the present disclosure.

Apparatuses and methods for performing a buffer operation in memory are provided. In one or more embodiments of the present disclosure, a controller coupled to an array of memory cells can be configured to program first page data to the array of memory cells while storing second page data and third page data on a buffer and program the second page data and the third page data from the buffer to the array of memory cells.

One example method can include storing second page data and third page data on a buffer while programming first page data during a first pass programming operation and programming the second page and third page data from the buffer to the array of memory cells during a second pass programming operation. When the first page programming operation is complete before the second page data and third page data is stored on the buffer, a two-pass programming operation can have the same write performance as a another programming operation that programs in one-pass. When the second page and third page data is stored on the buffer before the first page programming operation is complete, a two-pass programming operation can have a better write performance than a another programming operation that programs in two-pass.

A number of embodiments of the present disclosure maintain the read-window margin benefits of a two-pass programming operation, which are better than a read-window margin of a one-pass programming operation, the write performance is the same as the one-pass programming operation because the input/ouput (I/O) overhead is reduced by storing the second page data and the third page data on the buffer while programming the third page data during the first pass.

In one or more embodiments, the controller coupled to the array of memory cells is configured to send the second page data and the third page data on an I/O line to a buffer, which includes a repetitive circuit element for each bit line and holds data for pages programmed to the array of memory cells. The controller takes between 100 and 200 uS to send the first page data to the array of memory cells and while the first page is being programmed, the buffer is available to store the second page data and the third page data. In a number of embodiments, the array of memory cells can be programmed in two passes with eight program states and/or programmed in four passes with sixteen program states.

In previous approaches, one-pass programming and two-pass programming were executed by inputting each page of data and then programming each page data once each page of data had been received. In previous approaches, one-pass programming provided better write performance while two-pass programming provided better read window margin.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "C", "M", and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 101 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-C (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-C via a plurality of channels, including input/output (I/O) lines 111-1, . . . , 111-C, and can be used to send data between the memory system 104 and a host 102. The I/O lines 111-1, . . . , 111-C can also be used to send data from the controller 108 to the memory devices 110-1, . . . , 110-C The host interface 106 can be in the form of a standardized interface. For example, when the memory system 104 is used for data storage in a computing system 101, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the number of memory devices 110-1, . . . , 110-C (which in some embodiments can be a number of memory arrays on a single die) to control data read, write, and erase operations, among other operations. In some embodiments, the controller 108 can be on the same die or a different die than any or all of the number of memory devices 110.

Although not specifically illustrated, in some embodiments, the controller 108 can include a discrete memory channel controller for each channel coupling the controller 108 to the memory devices 110-1, . . . , 110-C. The controller 108 can include, for example, a number of components in the form of hardware and/or firmware (e.g., one or more integrated circuits) and/or software for controlling access to the number of memory devices 110-1, . . . , 110-C and/or for facilitating data transfer between the host 102 and memory devices 110-1, . . . , 110-C.

As illustrated in FIG. 1, the controller 108 can include a buffer 112. For example, the buffer 112 can include latches and circuitry. The buffer 112 can have discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, the buffer 112 can be external to the controller 108 or have a number of components located within the controller 108 and a number of components located external to the controller 108.

The buffer 112 can improve write performance of the computing system 101. Write performance is determined by summing program time and data input time. The buffer 112 can store second page data and third page data during a first page programming operation on a number of memory devices 110-1, . . . , 110-C. Then program the second page data and the third page data from the buffer 112 to the number of memory devices 110-1, . . . , 110-C. The buffer 112 can decrease data input time because data is being inputted into the buffer 112 during programming of the number of memory devices 110-1, . . . , 110-C.

The number of memory devices 110-1, . . . , 110-C can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. The number of memory devices 110-1, . . . , 110-C can also include buffers 113-1, . . . , 113-C.

In operation, data can be written to and/or read from memory (e.g., memory devices 110-1, . . . , 110-C of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

According to a number of embodiments of the present disclosure, the controller 108 can be configured to write data to a group of memory cells (e.g., a physical page of memory cells) of a memory array a plurality of times with a respective plurality of discrete write signals each having a different magnitude. The controller 108 (e.g., via buffer 112) can store second page data and a third page data during a first page programming operation on the memory array. In some embodiments, storing the second page data and the third page data on the buffer 112 is completed before the first page programming operation. In other embodiments, the first page programming operation is completed before storing the second page data and the third page data on the buffer 112 is completed. Such embodiments can be beneficial to write performance by reducing data input time. Storing the second page data and the third page data can be performed during the first page programming because the buffer 112 is available.

Figure 2:
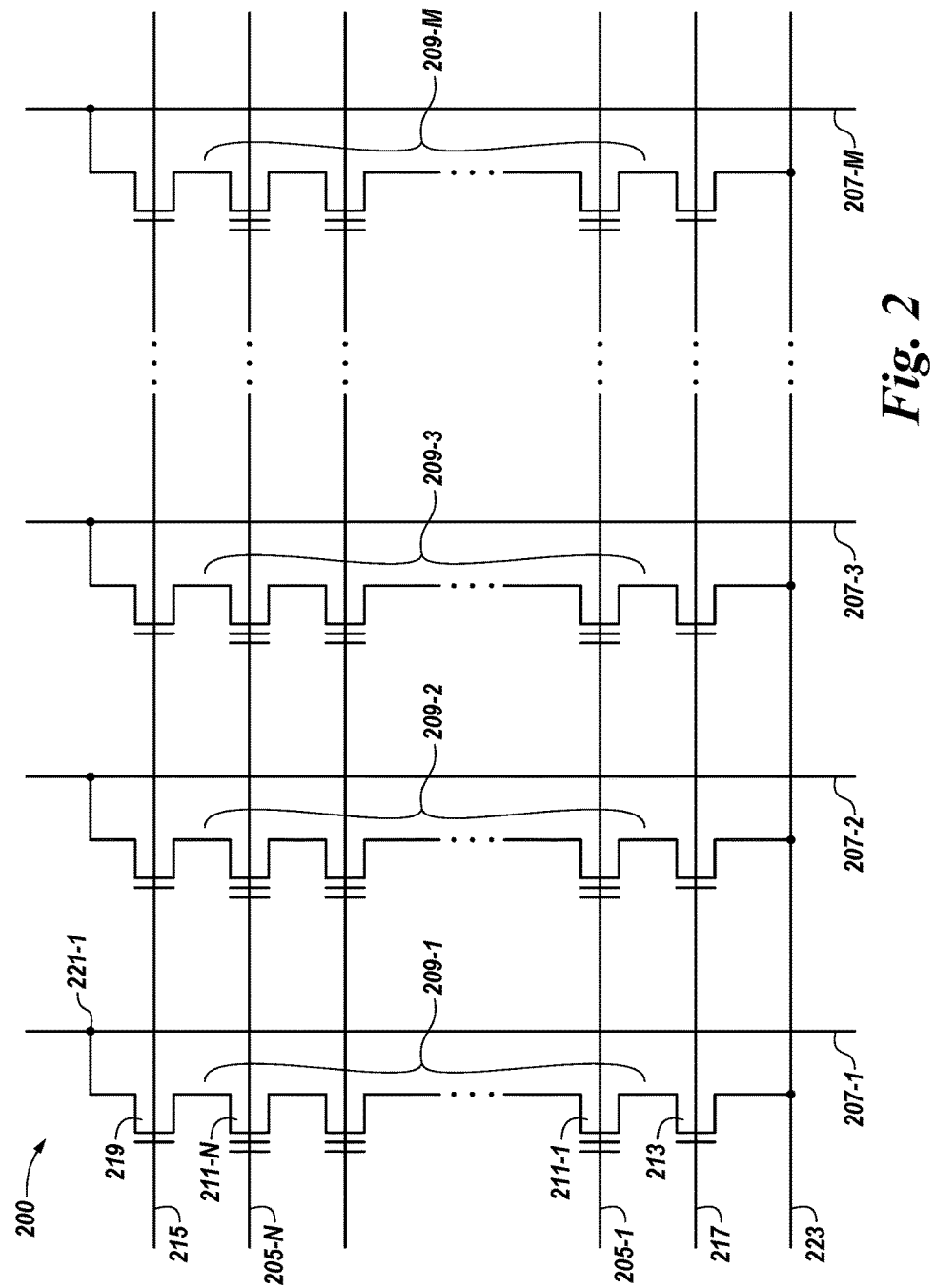
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The embodiment of FIG. 2 illustrates a NAND architecture non-volatile memory array. However, embodiments described herein are not limited to this example. As shown in FIG. 2, the memory array 200 includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 200 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . 207-M. The memory cells 211-1, . . . 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Figure 3:
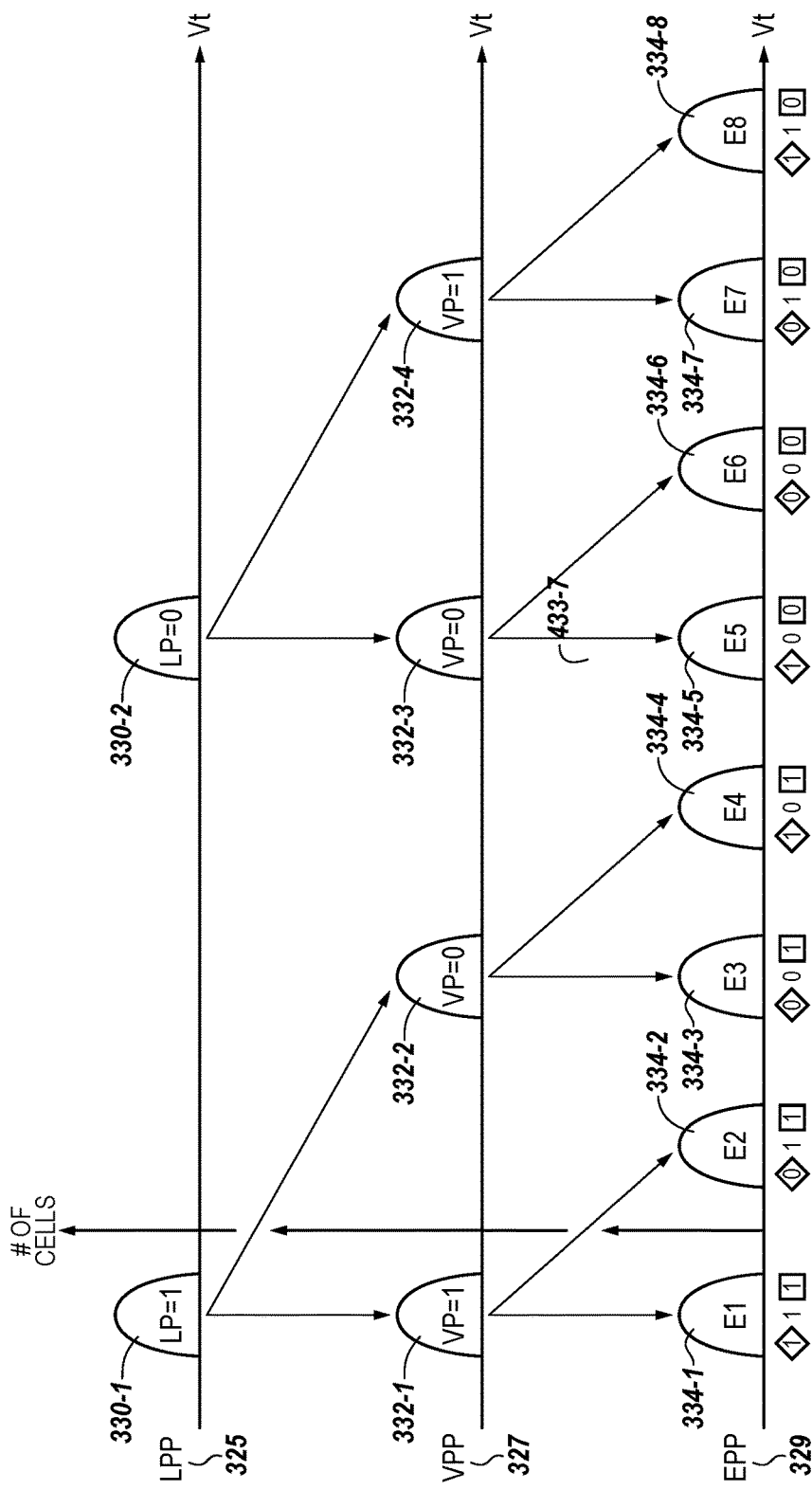
FIG. 3 illustrates a diagram associated with programming memory cells in accordance with a number of embodiments of the present disclosure.

The diagram shown in FIG. 3 illustrates threshold voltage (Vt) distributions of a number of cells after a lower page programming (LPP) process 325, a upper page programming (UPP) process 327, and an extra page programming (EPP) process 329. As one of ordinary skill in the art will appreciate, NAND flash memory cells can be erased prior to having new data programmed thereto.

As part of the LPP process 325, the Vt of the memory cells are adjusted (e.g., via programming pulses applied to a selected word line) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325. A lower page is a lower order page and is programmed in the array of memory cells before higher order pages are programmed.

As part of the UPP process 327, the Vt of the memory cells are adjusted to one of four levels represented by Vt distributions 332-1, 332-2, 332-3, and 332-4. In this example, cells whose upper page is to store a bit value of "1" (e.g., UP=1) are programmed to one of distributions 332-2 and 332-3 during UPP process 327, and cells whose upper page is to store a bit value of "0" (e.g., UP=0) are programmed to one of distributions 332-1 and 332-4 during UPP process 327. An upper page is a higher order page. A higher order page is programmed after a lower order page because the buffer requires bit level information of the lower order page when the higher order page is being programmed.

As part of the EPP process 329, the Vt of the memory cells are adjusted to one of eight levels represented by Vt distributions 334-1 to 334-8, which correspond to data states E1 to E8, respectively, with each one of data states E1 to L8 indicating a different 3-bit stored bit pattern. In this example, cells programmed to data state E1 store data "111," cells programmed to data state E2 store data "011," cells programmed to data state E3 store data "001," cells programmed to data state E4 store data "101," cells programmed to data state E5 store data "100," cells programmed to data state E6 store data "000," cells programmed to data state E7 store data "010," and cells programmed to data state E8 store data "110." An extra page is a higher order page. The buffer requires bit level information of the lower order page when the higher order page is being programmed due to a verify voltage for the higher order page is dependent on the information stored in the lower order page.

In operation, cells programmed to higher Vt levels may have an increased retention noise as compared to cells programmed to lower Vt levels. For instance, the Vt of cells programmed to data states E7 and E8 may be more prone to increased shifting over time as compared to the Vt of cells programmed to data states E1 and E2. As such, retention noise can be reduced by providing a coding scheme that skews the stored bit patterns toward those stored bit patterns corresponding to lower Vt levels. In the example illustrated in FIG. 3, memory cells storing bit patterns "100," "000," "010," and "110" (e.g., those cells programmed to data states E5, E6, E7, and E8, respectively) correspond to cells whose lower page stores bit value "0." Memory cells storing bit patterns "111," "011," "001," and "101" (e.g., those cells programmed to data states E1, E2, E3, and E4, respectively) correspond to cells whose lower page stores bit value "1." Therefore, cells storing bit value "1" in their lower page (e.g., cells programmed to Vt distribution 330-1 during LPP process 325) have a lower Vt level than cells storing bit value "0" in their lower page (e.g., cells programmed to Vt distribution 330-2 during LPP process 325). If uniformly random data is received (e.g., from a host), it would be expected that the received data will comprise 50% "1"s and 50% "0"s. As such, according to the programming process shown in FIG. 3, 50% of the cells (e.g., cells storing bit value "1" in their lower page) would be programmed to one of data states E1 to E4, and 50% of the cells (e.g., cells storing bit value "0" in their lower page) would be programmed to one of data states E5 to E8. Moreover, if the received data is to be programmed to a group of cells as a lower page of data, 50% of the cells will be programmed to Vt distribution 330-1 and 50% of the cells will be programmed to Vt distribution 330-2.

Figure 4:
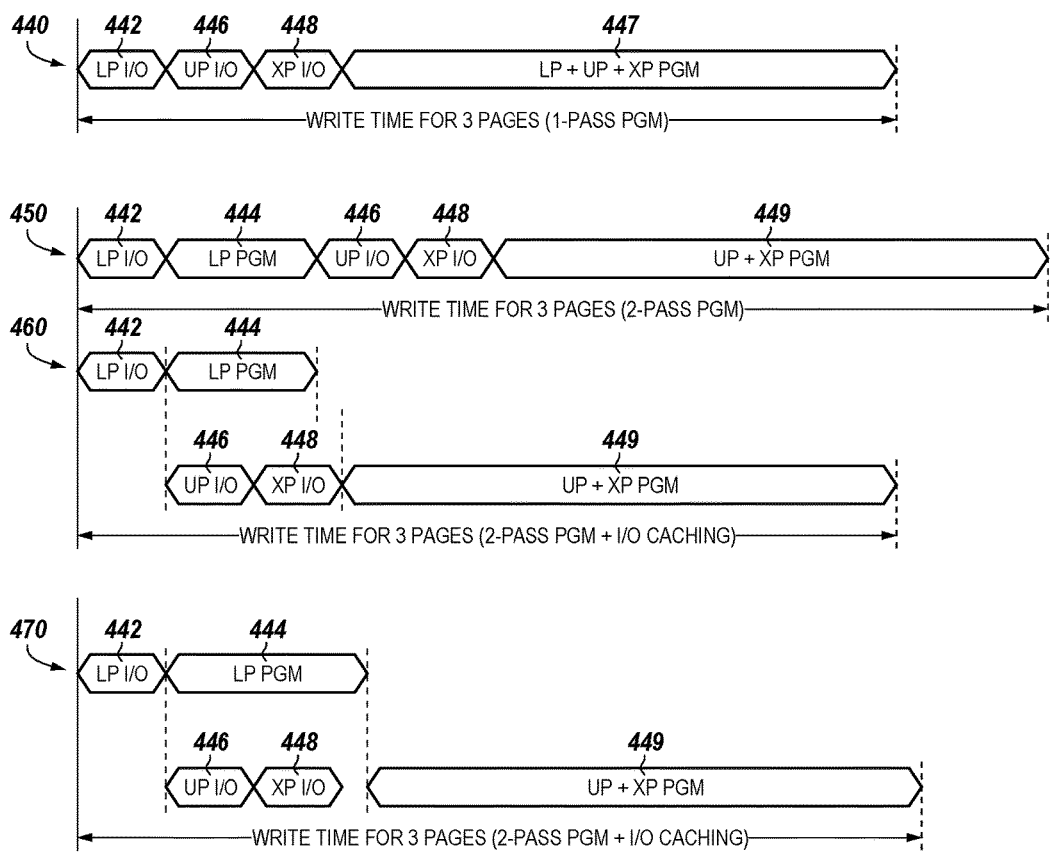
FIG. 4 illustrates timing diagrams associated with performing buffer operations in accordance with a number of embodiments of the present disclosure.

FIG. 4 illustrates timing diagrams associated with performing buffer operations in accordance with a number of embodiments of the present disclosure. FIG. 4 illustrates four timing diagrams 440, 450, 460, and 470 associated with storing a first page, a second page, and third page data on a buffer and programming the first page, second page, and third page on an array of memory cells. FIG. 4 illustrates the write performance time for various sequences of data input and programming. The timing diagrams 440, 450, 460, and 470 of FIG. 4 show operations for writing data which includes lower page data input (LP I/O 442), lower page programming (LP PGM 444), upper page data input (UP I/O 446), extra page data input (XP I/O 448), upper page and extra page programming (UP+XP PGM 449), and lower page, upper page, and extra page programming (LP+UP+XP PGM 447). The lower page (LP) can be referred to as the first page, the upper page (UP) can be referred to as the second page, and the extra page (XP) can be referred to as the third page. The particular order of each data input and programming are discussed below with respect to each timing diagram.

The timing diagram 440 of FIG. 4 illustrates a write time for three pages of data with one-pass programming according to previous approaches. First the LP, UP, and XP are stored on the buffer (LP I/O 442, UP I/O 446, and XP I/O 448) and then the LP, UP, and XP are programmed to the array of memory cells (LP+UP+XP PGM 447).

The timing diagram 450 of FIG. 4 illustrates a write time for three pages of data with two-pass programming according to previous approaches. On the first pass, the LP data is stored on the buffer (LP I/O 442) and then the LP is programmed to the array of memory cells (LP PGM 444). On the second pass, the UP data is stored on the buffer (UP I/O 446) and the XP data is stored on the buffer (XP I/O 448) and then the UP and XP are programmed to the array of memory cells (UP+XP PGM 449). Write performance is determined by summing program time and data input time. Data input time includes the time to store the LP I/O 442, UP I/O 446, and XP I/O 448 data on the buffer. Program time includes the time to program the LP (LP PGM 444), UP, and XP (UP+XP PGM 449). As shown in FIG. 4, the timing diagram 450 has the worst write performance of the four timing diagrams because the write time for three pages of data with two-pass programming has the longest program and data input time. However, two-pass programming provides a better read window margin than one-pass programming.

The timing diagram 460 of FIG. 4 illustrates a write time for three pages of data with two-pass programming and input/output (I/O) caching. First, the LP data is stored on the buffer (LP I/O 442) and then the UP data is stored on the buffer (UP I/O 446) and XP data is stored on the buffer (XP I/O 448) while the LP is programmed to the array of memory cells (LP PGM 444). Last, the UP and XP are programmed to the array of memory cells (UP+XP PGM 449). Here the LP PGM 444 is completed before the UP I/O 446 and XP I/O 448 is completed. As shown in FIG. 4, three pages of data with two-pass programming and I/O caching timing diagram 460 has the same write performance as the three pages of data with one-pass programming timing diagram 440. The three pages of data with two-pass programming and I/O caching, where the LP PGM 444 is complete before the UP I/O 446 and XP I/O 448 is complete has the same write performance as the three pages of data with one-pass programing and retains the read-window margin of two-pass programming.

The timing diagram 470 of FIG. 4 illustrates a write time for three pages of data with two-pass programming and I/O caching, where the UP data is stored on the buffer (UP I/O 446) and XP data is stored on the buffer (XP I/O 448) before the LP data is programmed to the array of memory cells (LP PGM 444). Then the UP and XP are programmed to the array of memory cells (UP+XP PGM 449). As shown in FIG. 4, the three pages of data with two-pass programming and I/O caching timing diagram 470 has better write performance than the timing diagram 450 of FIG. 4, which illustrates three pages of data with two-pass programming because the write time for three pages of data with two-pass programming and I/O caching, where the UP I/O 446 and XP I/O 448 is completed before the LP PGM 444 is completed, has a shorter program and data input time than 450.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein, will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells; and
a controller coupled to the array of memory cells and configured to:
program first page data to the array of memory cells while storing second page data and third page data on a buffer, wherein the first page is a lower page (LP), the second page is an upper page (UP), and the third page is an extra page (XP); and
program the second page data and the third page data from the buffer to the array of memory cells.

2. The apparatus of claim 1, wherein the array of memory cells includes the buffer.

3. The apparatus of claim 2, wherein the controller is configured to send the second page data and the third page data on an input/output (I/O) line to the buffer while programming the first page data.

4. The apparatus of claim 1, wherein the buffer is located on the controller.

5. The apparatus of claim 1, wherein the buffer holds data for pages programmed to the array of memory cells.

6. The apparatus of claim 1, wherein the buffer is available to store the second page and third page while the first page data is being programmed.

7. The apparatus of claim 1, wherein the array of memory cells are programmed in two passes with eight program states.

8. The apparatus of claim 1, wherein the array of memory cells are programmed in four passes with sixteen program states.

9. The apparatus of claim 1, wherein the first page is a lower page (LP), the second page is an upper page (UP), and the third page is an extra page (XP).

10. An apparatus, comprising:
an array of memory cells;
a buffer coupled to the array of memory cells; and
a controller coupled to the array of memory cells and buffer and configured to:
send first page data to the array of memory cells;
store second page data and third page data on the buffer during a first pass programming operation that stores the first page data in the array of memory cells; and
program the second page data and the third page data from the buffer to the array of memory cells during a second pass programming operation, wherein a lower order page is programmed in the array of memory cells before a higher order page is programmed in the array of memory cells.

11. The apparatus of claim 10, wherein the controller takes between 100 and 200 uS to send the first page data to the array of memory cells.

12. The apparatus of claim 10, wherein the buffer includes a repetitive circuit element for each bit line.

13. The apparatus of claim 10, wherein the first pass programming operation is completed before storing the second page data and the third page data on the buffer is completed.

14. The apparatus of claim 10, wherein storing the second page data and third page data on the buffer is completed before the first programming operation is complete.

15. The apparatus of claim 10, wherein performance time to program first, second, and third data is the same as is the same as another operation that programs memory cells in one-pass.

16. A method comprising:
storing second page data and third page data on a buffer while programming first page data during a first pass programming operation; and
programming the second page data and the third page data from the buffer to the array of memory cells during a second pass programming operation, wherein input/output (I/O) overhead is reduced by storing the second page data and the third page data on the buffer while programming the first page data during the first pass programming operation.

17. The method of claim 16, wherein the method includes sending the data to the buffer on the controller.

18. The method of claim 16, wherein the method includes sending the data to the buffer in the array of memory cells.

19. The method of claim 18, wherein further including sending the data to the buffer via an input output (I/O) line.

20. The method of claim 16, wherein input/output (I/O) overhead is reduced by storing the second page data and third page data on the buffer while programming the third page data during the first pass programming operation.

21. The method of claim 16, wherein the second page is an upper page (UP), the third page is an extra page (XP), and the first page is a lower page (LP).

22. The method of claim 16, wherein a lower order page is programmed in the array of memory cells before a higher order page is programmed in the array of memory cells.

23. The method of claim 22, wherein a higher order page includes the second page data and the third page data and a lower order page include the first page data.

24. The method of claim 23, wherein the buffer includes bit level information of the lower order page when the higher order page is being programmed due to a verify voltage for the higher order page is dependent on the information stored in the lower order page.

25. A method, comprising:
storing second page data and third page data on a buffer during a first page programming operation on an array of memory cells, wherein the first page programming operation is complete before storing the second page data and the third page data is completed; and
programming the second page data and the third page data in the buffer to the array of memory cells when storing the second page data and the third page data is completed, wherein the array of memory cells are programmed in two passes with eight program states.

26. The method of claim 25, wherein the first page data is programmed on a first pass.

27. The method of claim 25, wherein the second page data and the third page data are programmed on a second pass.

28. A method, comprising:
storing second page data and third page data on a buffer during first page programming on an array of memory cells, wherein storing the second page data and the third page data is complete before the first page programming operation is complete; and
programming the second page data and third page data from the buffer to the array of memory cells when the first page programming is complete, wherein input/output (I/O) overhead is reduced by storing the second page data and the third page data on the buffer during the first page programming.

29. The method of claim 28, wherein program time includes time to program the first page, second page, and third page data in the array of memory cells.

30. The method of claim 29, wherein data input time includes time to store the second page data and third page data on the buffer.

31. The method of claim 30, wherein write performance is determined by summing program time and data input time.

* * * * *